(12) United States Patent
Völker et al.

(10) Patent No.: US 10,081,069 B2
(45) Date of Patent: Sep. 25, 2018

(54) DEVICE FOR SOLDERING ELECTRICAL OR ELECTRONIC COMPONENTS

(71) Applicant: ERSA GmbH, Wertheim (DE)

(72) Inventors: Stefan Völker, Hafenlohr (DE); Egon Spachmann, Boxtal (DE)

(73) Assignee: ERSA GMBH, Wertheim (DE)

( * ) Notice: Subject to any disclaimer, the term of this patent is extended or adjusted under 35 U.S.C. 154(b) by 72 days.

(21) Appl. No.: 14/752,060

(22) Filed: Jun. 26, 2015

(65) Prior Publication Data
US 2016/0184914 A1 Jun. 30, 2016

(30) Foreign Application Priority Data
Dec. 29, 2014 (DE) .......................... 10 2014 119 682

(51) Int. Cl.
| | |
|---|---|
| *B23K 3/06* | (2006.01) |
| *H05K 3/34* | (2006.01) |
| *B23K 1/00* | (2006.01) |
| *B23K 1/08* | (2006.01) |
| *B23K 101/36* | (2006.01) |

(52) U.S. Cl.
CPC .......... *B23K 3/0607* (2013.01); *B23K 1/0016* (2013.01); *B23K 1/08* (2013.01); *B23K 3/0653* (2013.01); *H05K 3/34* (2013.01); *B23K 2201/36* (2013.01); *H05K 2203/042* (2013.01)

(58) Field of Classification Search
None
See application file for complete search history.

(56) References Cited

U.S. PATENT DOCUMENTS

| | | | | |
|---|---|---|---|---|
| 4,886,201 A | * | 12/1989 | Deambrosio | ........ B23K 3/0653 228/37 |
| 4,981,249 A | * | 1/1991 | Kawashima | ......... B23K 3/0653 228/37 |
| 5,411,197 A | * | 5/1995 | Nakamura | ........... B23K 3/0653 228/34 |

(Continued)

FOREIGN PATENT DOCUMENTS

| | | |
|---|---|---|
| DE | 112011100931 T5 | 7/2013 |
| JP | 2004122220 A | 4/2004 |
| WO | 9519864 A1 | 7/1995 |

OTHER PUBLICATIONS

European Patent Office, Search Report, Application No. 15185068.2, dated Jun. 24, 2016.

(Continued)

*Primary Examiner* — Devang R Patel
(74) *Attorney, Agent, or Firm* — Quarles & Brady LLP

(57) ABSTRACT

A device for soldering electrical or electronic components on a printed circuit board includes a soldering nozzle arrangement arranged above a solder crucible. The nozzle arrangement includes at least one carrier, on which at least one soldering nozzle is arranged. Molten solder is conveyed, using a conveyor unit, out of the solder crucible through the soldering nozzle to the components to be soldered. At least one discharge unit is arranged between a tip of the soldering nozzle and the carrier for any excess solder that has left the soldering nozzle. The discharge unit includes at least one baffle plate substantially surrounding the soldering nozzle.

11 Claims, 8 Drawing Sheets

(56) References Cited

U.S. PATENT DOCUMENTS

| | | | |
|---|---|---|---|
| 5,772,101 A * | 6/1998 | Nishimura | B23K 3/0653 228/260 |
| 6,581,818 B1 | 6/2003 | Tu | |
| 6,655,574 B2 * | 12/2003 | Schouten | B23K 3/0653 228/260 |
| 8,403,199 B2 * | 3/2013 | Sato | B23K 1/085 228/37 |
| 2003/0066866 A1 * | 4/2003 | Takaguchi | B23K 3/0607 228/180.1 |
| 2003/0121950 A1 | 7/2003 | Tu | |
| 2011/0226843 A1 * | 9/2011 | Yanaros | B23K 1/0008 228/260 |
| 2012/0024938 A1 | 2/2012 | Yoshino et al. | |

OTHER PUBLICATIONS

State Intellectual Property Office of People's Republic of China, First Office Action and Search Report, Application No. 201510387346.6, dated Apr. 10, 2018, 17 pages.

\* cited by examiner

DEVICE FOR SOLDERING ELECTRICAL OR ELECTRONIC COMPONENTS

CROSS REFERENCE TO RELATED APPLICATION

This application claims the priority benefit of German Patent Application No. 10 2014 119 682.1 filed on Dec. 29, 2014, which is fully incorporated herein by reference.

STATEMENT REGARDING FEDERALLY SPONSORED RESEARCH OR DEVELOPMENT

Not applicable.

FIELD OF THE INVENTION

The invention relates to a device for soldering electrical or electronic components on a printed circuit board.

BACKGROUND OF THE INVENTION

Devices of the type in question predominantly, but by no means exclusively, serve to solder electronic components on a printed circuit board, wherein the soldering pins of the components being arranged on the upper side of the printed circuit board or blank reach through the printed circuit board in recesses and project, at least slightly, beyond the lower side of the blank. Soldering is then either effected by advancing the blank to a point above a soldering nozzle unit that is fixedly arranged, with a solder wave leaving the soldering nozzle (wave soldering), or by a soldering nozzle arrangement approaching the areas to be soldered, said arrangement having one or more soldering nozzle(s) being adapted to the relevant conditions, solder constantly leaving the nozzle/s, wherein the pins to be soldered are dipped into the solder (dip soldering). Since only a small part of the molten solder that leaves the soldering nozzles is used for the actual soldering procedure, the excess solder is discharged and is returned into the melting crucible. If the solder, due to the forces of gravity, simply flows or falls back into the melting crucible now, there is the risk of spatters being formed when the solder hits the carrier fixing the soldering nozzles or the liquid level of the molten solder in the crucible, which spatters may lead to a functional failure of components having been soldered in such a manner if they get on the lower side of the printed circuit board. This risk is increased even further if soldering is effected under shielding gas, in particular in the form of nitrogen, since the liquid solder tends to form balls and/or spatters very often under a nitrogen atmosphere.

For diminishing this problem, it is known to furnish the soldering nozzles with inclined drain or guide plates, which are supposed to provide for controlled flowing off of the excess solder. In particular for a multitude of soldering nozzles that are very close to each other, it is not possible to use such guide plates.

SUMMARY OF THE INVENTION

Proceeding from this state of the art, it is the object of the present invention to create a generic device that does not present these disadvantages. This object is attained by means of a device described herein. In particular, the device for soldering electrical or electronic components on a printed circuit board, in an initially known manner, features a soldering nozzle arrangement having at least one carrier, on which at least one soldering nozzle is arranged. In this respect, the carrier can be embodied in any desired manner, for instance as a frame or as a plate. In this respect, it is substantially crucial that the carrier is able to accommodate and hold the soldering nozzle. The soldering nozzle arrangement is arranged above a melting or solder crucible in such a manner that molten solder, using a conveyor unit, which can, for instance, feature a solder pump and an ascension pipe, is conveyed out of the solder crucible, through the soldering nozzle, to the components to be soldered.

In an embodiment of the invention, at least one discharge unit for any excess solder that has left the soldering nozzle is provided, said discharge unit being arranged between the tip of the soldering nozzle and the carrier, wherein the discharge unit features at least one baffle plate, which substantially reaches around the soldering nozzle. In other words, this initially means that, in the melting crucible, a parting plane is put in between the tip of the soldering nozzle and the carrier and thus also between the tip of the soldering nozzle and the liquid level of the molten solder, said parting plane reducing the drop height of the solder and thus the kinetic energy thereof, such that spatters are prevented from being formed or are formed at least to a reduced extent. Due to the fact that the baffle plate substantially reaches around the soldering nozzle, it is basically irrelevant at which side of the soldering nozzle the solder flows off. If the solder is now further discharged from the baffle plate into the melting crucible, the lower side of the printed circuit board is shielded from any possible spatters by way of the lower side of the baffle plate.

Preferably, the baffle plate reaches around the soldering nozzle in a substantially form-fitting fashion, such that a sealing effect can be achieved between the baffle plate and the soldering nozzle.

The baffle plate can be embodied as a baffle plate unit having a multitude of plate segments, which, as a whole, form the baffle plate when they are assembled. Preferably, the baffle plate is, however, substantially embodied as one piece and features at least one recess, through which the soldering nozzle reaches.

According to a further embodiment, the baffle plate is arranged substantially horizontally, that is to say substantially parallel to the solder level in the melting crucible, or it is embodied so as to be slightly inclined. In this respect, a slight inclination in particular allows for discharging the solder from the baffle plate back into the melting crucible in a controlled fashion.

In order to avoid uncontrolled flowing off of the solder from the baffle plate, the baffle plate can, according to a further exemplary embodiment, be limited by an edge projecting above the plane of the baffle plate in the direction of the soldering tip. In this respect, the edge can substantially completely surround the baffle plate or it can only be embodied in some portions or areas of the baffle plate.

For securely discharging the solder hitting the baffle plate, at least one drain opening for the solder can furthermore be provided in the baffle plate and/or in the edge. In the simplest case, said drain opening is a full drain opening in the plate or a notch in the edge.

In order to achieve secure draining of the solder into the melting crucible and to securely prevent spatters from being formed, according to a further embodiment, at least one downpipe for discharging the solder is arranged below the drain opening. In this respect, the downpipe can extend up to a point just above the liquid level of the molten solder in the crucible or can even dip into the solder, at least slightly.

In a basically known manner, not only a single soldering nozzle, but rather a multitude of soldering nozzles in any desired arrangement can be provided, which soldering nozzles can be arranged individually or in groups. In this respect, the baffle plate features a multitude of recesses, through which the soldering nozzles reach.

In order to be able to adapt, in particular, the discharge unit to different soldering conditions or printed circuit board configurations, according to a further embodiment, an adjusting unit can be provided, with which the distance between the baffle plate and the tip of the soldering nozzle and thus also the height of the baffle plate above the solder level in the melting crucible can be set.

In the simplest case, the adjusting unit in this respect features at least one adjusting screw, which reaches through the baffle plate and indirectly or directly comes to rest against the carrier, being supported by the same.

In order to minimize the consumption of shielding gas when employing the device in accordance with the invention under a shielding gas atmosphere, according to a further exemplary embodiment of the invention, at least one gas injection cap for introducing a shielding gas can be provided at the area of the printed circuit board to be soldered, said gas injection cap reaching around or over the discharge unit and the soldering nozzle or the multitude of soldering nozzles.

BRIEF DESCRIPTION OF THE DRAWINGS

In the following, the invention is explained in greater detail with the help of drawings only constituting exemplary embodiments.

In the figures.

DETAILED DESCRIPTION OF THE EXAMPLE EMBODIMENTS

Figure 1:
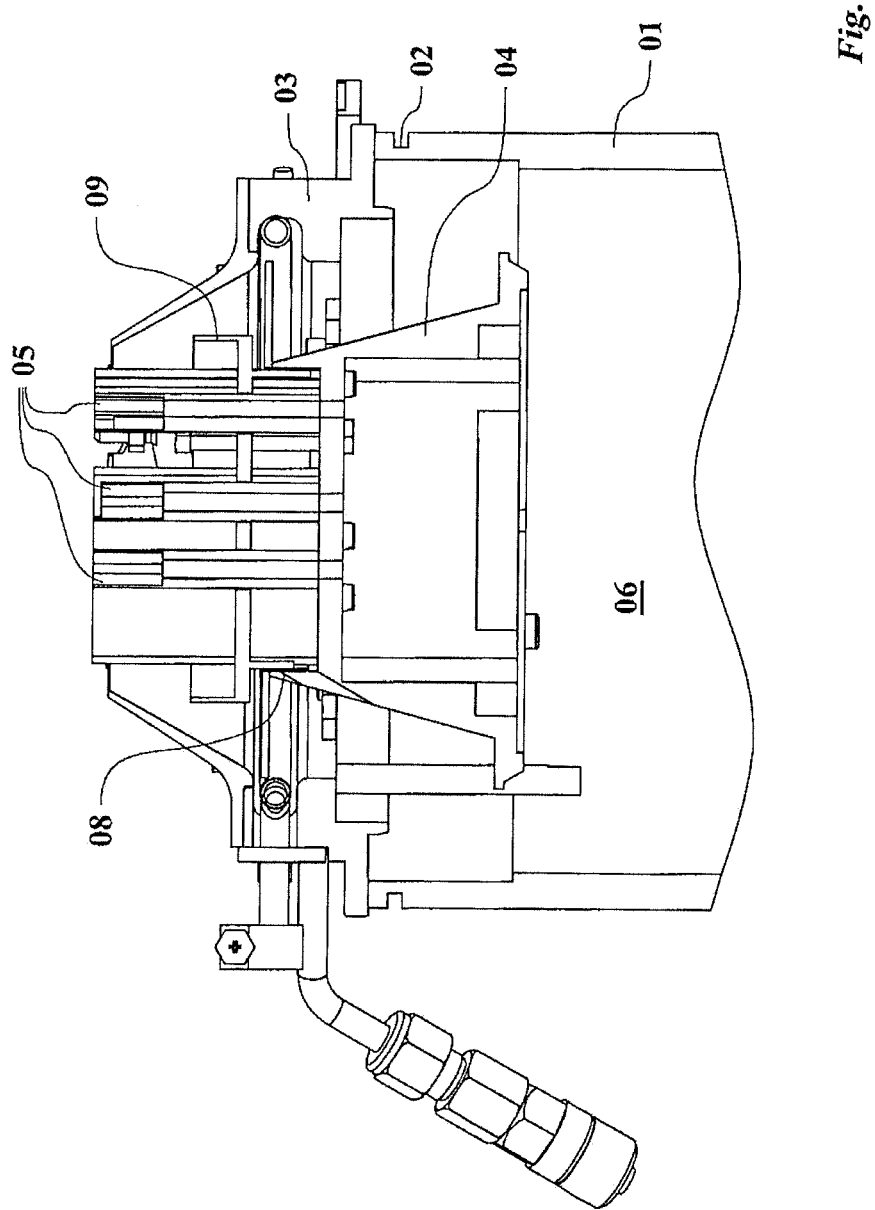
FIG. 1 shows, in a schematic sectional illustration, a first exemplary embodiment of the invention having a discharge unit fitted thereon.

The device being illustrated in FIG. 1, for soldering electrical or electronic components, features a solder crucible 01, which is closed by a lid 03 at its upper collar 02. At the lid 03, a carrier 04 is arranged, on which a multitude of soldering nozzles 05 is arranged such that molten solder 06 that is situated in the solder crucible 01 can initially be conveyed out of the solder crucible 01 to the soldering nozzles 05 via a conveyor unit not being illustrated.

The stream of molten solder 06 leaves the soldering nozzles 05 at their upper ends, wets the soldering pins of the electrical or electronic components that are arranged on a printed circuit board and in this way produces a fixed and, in particular, electrically conductive soldering connection after it has solidified. Any excess solder, due to the forces of gravity, flows downwards, indirectly or directly back into the solder crucible 01.

Figure 2:
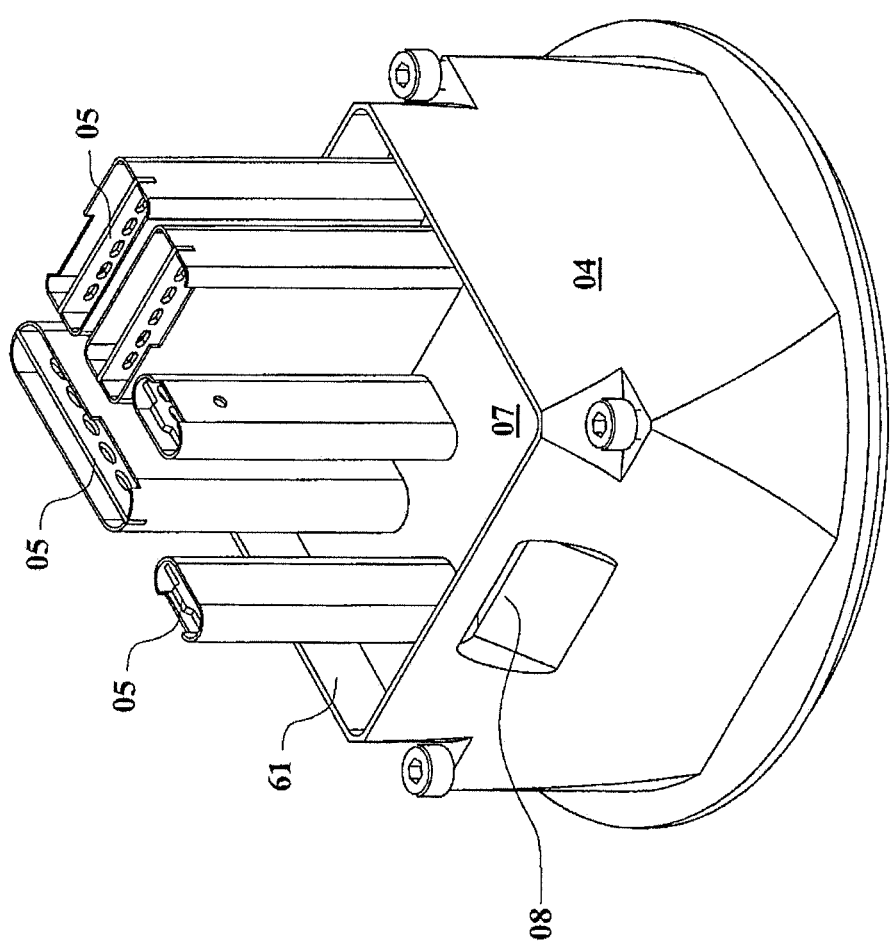
FIG. 2 shows the soldering nozzle arrangement of the exemplary embodiment according to FIG. 1 in a perspective illustration without the discharge unit.
Figure 3:
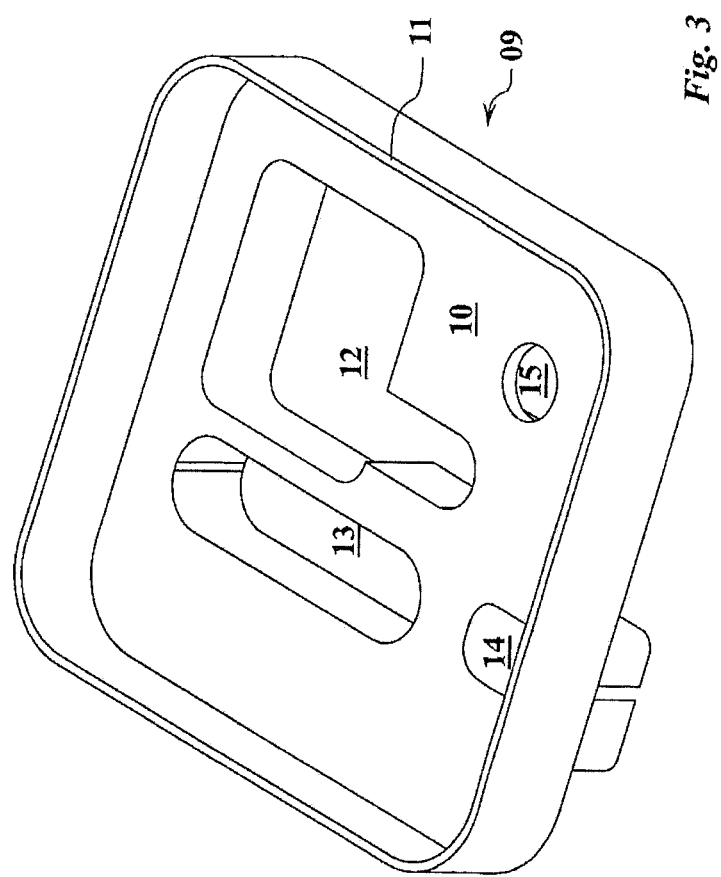
FIG. 3 shows the discharge unit of the exemplary embodiment according to FIG. 1 in an illustration that corresponds to FIG. 2.

As it can in particular be taken from FIG. 2, the carrier 04, in this exemplary embodiment, substantially features the form of a truncated pyramid, having a carrier plate 07, on which the soldering nozzles 05 are arranged, wherein the carrier plate 07 is limited by an edge 61 that substantially surrounds it completely. Any excess solder which flows off from the soldering nozzles 05 and which gets on the carrier 04 can flow back into the solder crucible 01 via recesses 08 that are arranged in the edge of the carrier plate 07. Since the drop height for the molten solder from the soldering nozzles onto the carrier plate 07 is comparatively great, there is the risk of solder spatters being formed, which, if they get on the lower side of the printed circuit board, entail the risk of soldering defects, due to, for instance, undesired bridging effects between adjacent soldering pins.

In order to avoid this risk, in accordance with the invention, a discharge unit 09 is arranged between the tips of the soldering nozzles 05 and the carrier. In this respect, the discharge unit 09 features a disk-shaped baffle plate 10, which is limited by an edge 11 that surrounds it completely. The baffle plate 11 features recesses 12, 13 and 14, which substantially correspond to the arrangement and outer contour of the soldering pins 05 with respect to their arrangement and shape.

Figure 4:
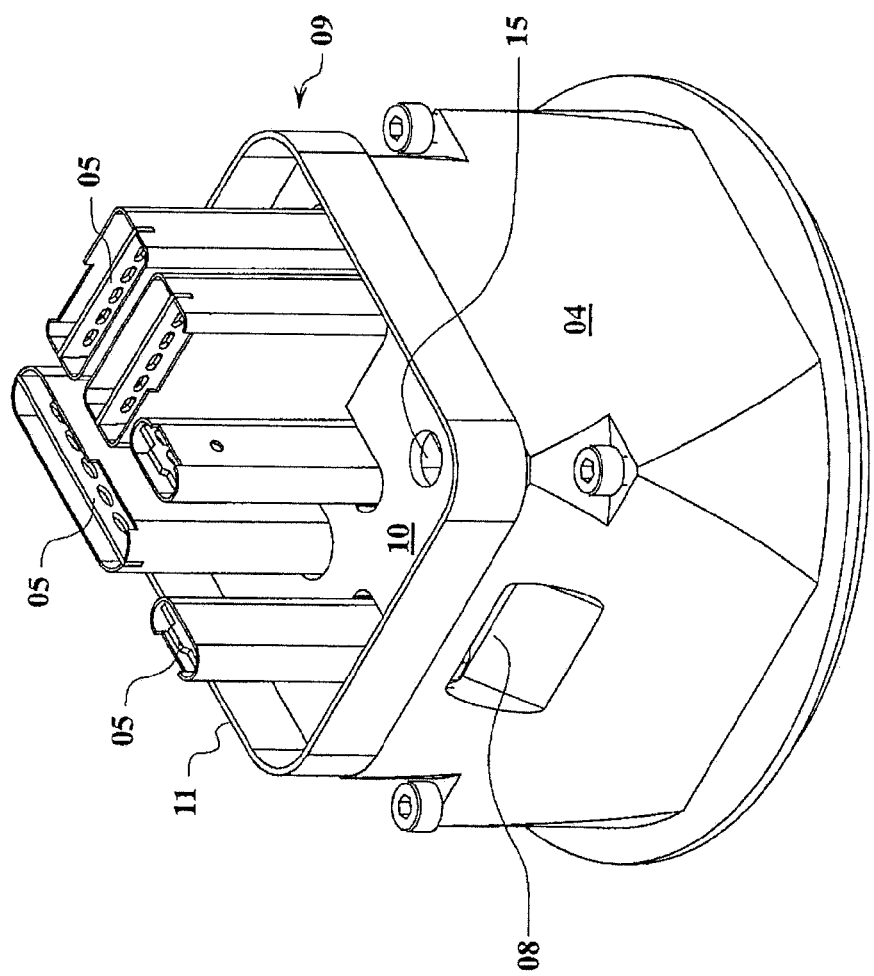
FIG. 4 shows the soldering nozzle arrangement according to FIG. 2, with the discharge unit according to FIG. 3 fitted thereon.

As it can in particular be taken from FIG. 4, the discharge unit 09 can be fitted on the soldering nozzle arrangement such that the baffle plate 10 reaches around the soldering nozzles 05 in a substantially form-fitting fashion and that the discharge unit 09, as a whole, is arranged between the tips of the soldering nozzles 05 and the carrier 04, wherein the discharge unit is supported on the carrier 04. If any excess molten solder that is leaving the tips of the soldering nozzles now flows downwards, due to the forces of gravity, it initially gets on the baffle plate 10 of the discharge unit 09. Due to the distance between the baffle plate 10 and the soldering nozzle tips, which is, by comparison, significantly smaller than the distance between the carrier plate 07 and the soldering nozzle tips, the formation of undesired solder spatters can in this respect be almost entirely precluded.

The solder that flows off onto the baffle plate 10 is discharged onto the carrier plate 07 through a further drain opening 15 and can be conveyed back into the solder crucible from there, via the recesses 08. In this respect, the distance between the carrier plate 07 and the baffle plate 10 is of no significance since the printed circuit board is shielded, by way of the baffle plate, from spatters that might arise when the solder flows off from the baffle plate 10 onto the carrier plate 07.

Figure 5:
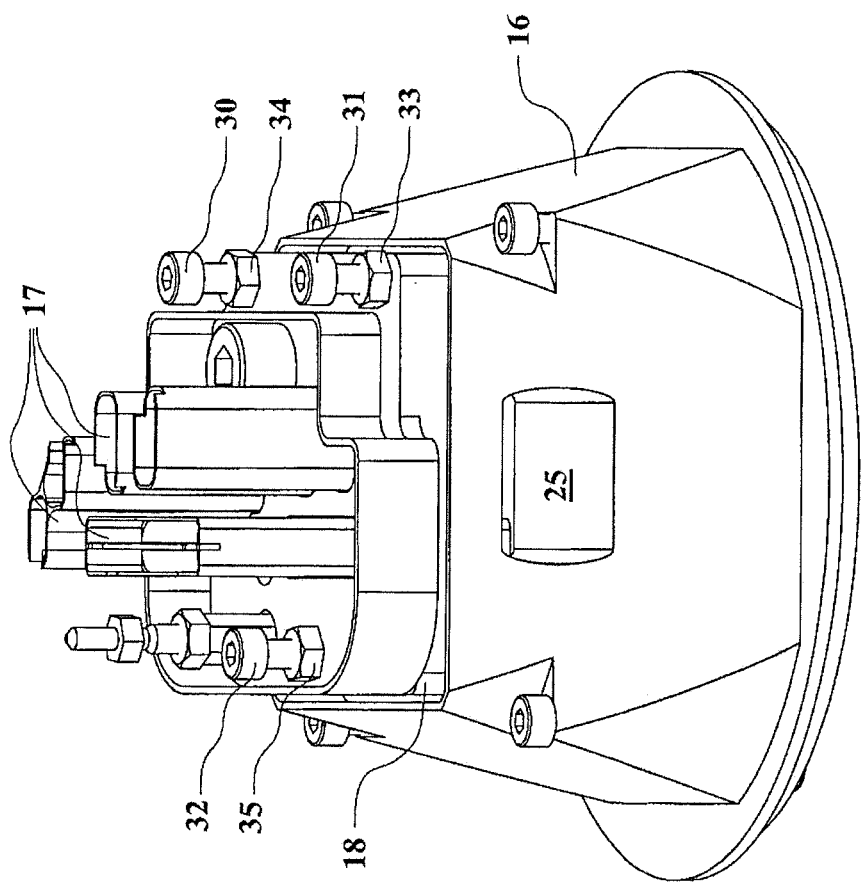
FIG. 5 shows a soldering nozzle arrangement according to a second exemplary embodiment of the present invention, with the discharge unit fitted thereon.
Figure 6:
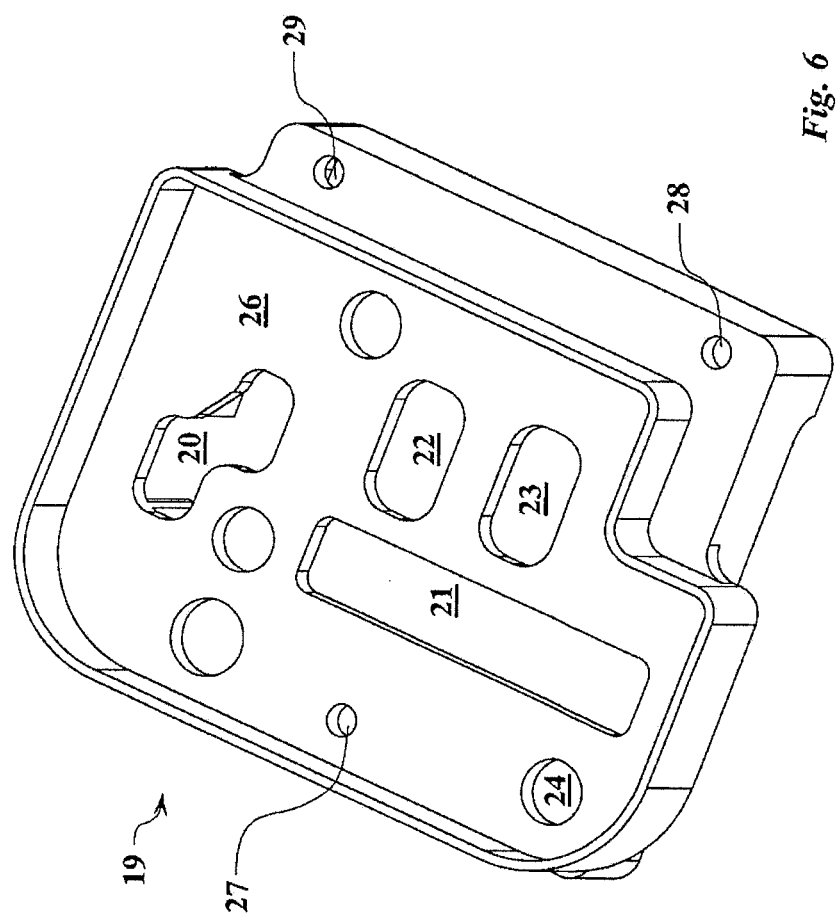
FIG. 6 shows the discharge unit of the exemplary embodiment according to FIG. 5.

The exemplary embodiment being illustrated in FIGS. 5 and 6 basically features the same structure as the exemplary embodiment according to FIGS. 1 to 4. The carrier 16, with respect to its function and structure, corresponds to the carrier 04 according to the embodiment having been described hereinbefore. A multitude of soldering nozzles 17 is arranged on the carrier plate 18 of the carrier 16. A discharge unit 19 likewise features recesses 20, 21, 22 and 23, via which the discharge unit, reaching around the soldering nozzles 17, can be fitted on the soldering nozzle arrangement. Any excess solder can flow off downwards onto the carrier plate 18, through the drain opening 24, and from there into the solder crucible via the recess 25.

As it can in particular be taken from FIG. 6, the discharge unit 19 is furnished with an adjusting unit, with which the distance between the baffle plate 26 and the tips of the soldering nozzles 17 can be set. Said adjusting unit features threaded holes 27, 28 and 29 in the discharge unit 19, into which the adjusting screws 30, 31 and 32 can be screwed such that they project downwards beyond the discharge unit 19, in the direction of the carrier plate 18, and come to rest against the carrier plate, in each instance with their shank tips, supporting the discharge unit 19. In this respect, by adjusting the adjusting screws 30, 31 and 32, the distance between the tips of the soldering nozzles 17 and the baffle plate 26 can be set in a simple manner. Via counter nuts 33, 34 and 35, the position of the adjusting screws 30, 31 and 32 can be identified and thus secured.

Figure 7:
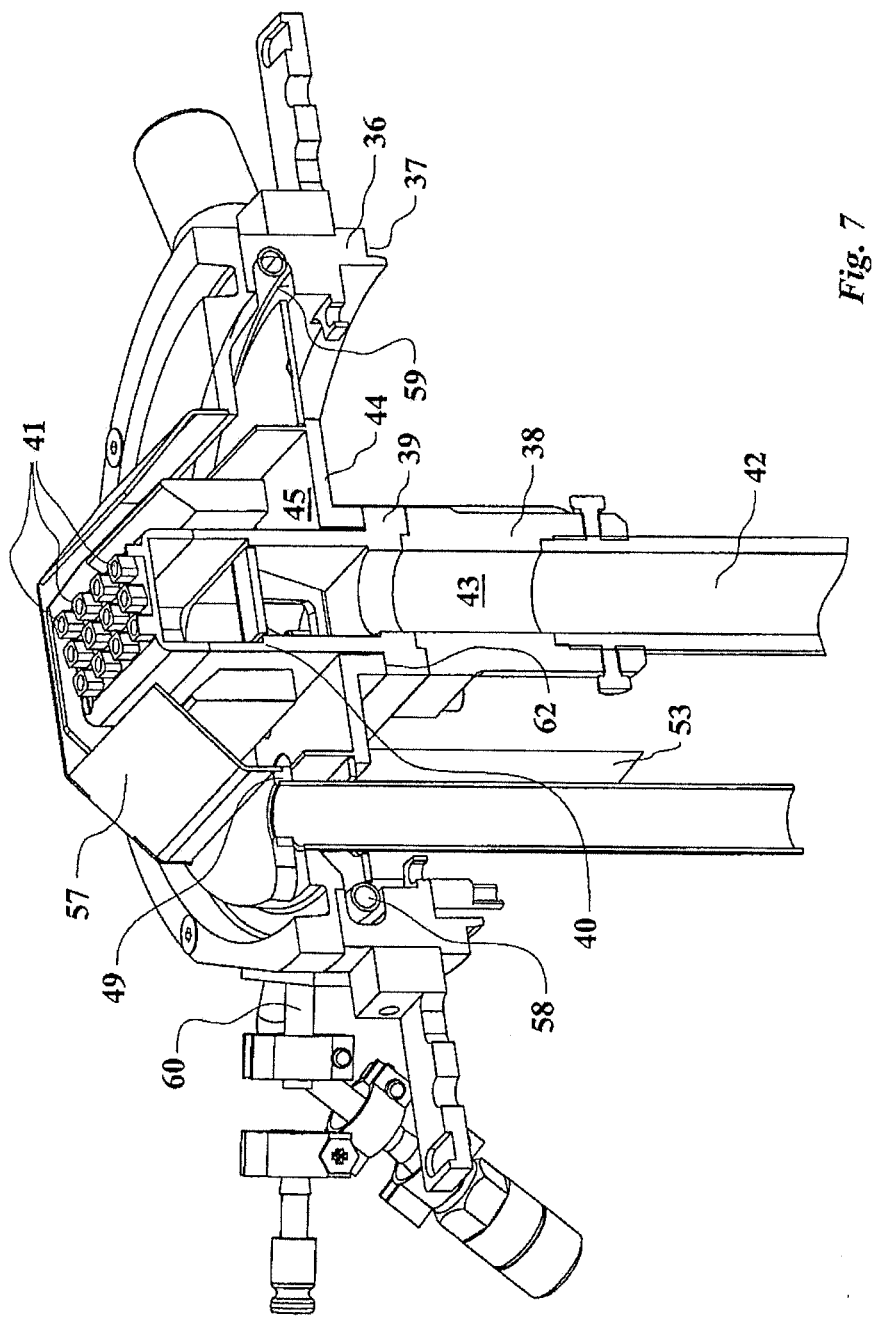
FIG. 7 shows, in a schematic perspective sectional illustration, a third exemplary embodiment of the invention with the discharge unit fitted thereon.
Figure 8:
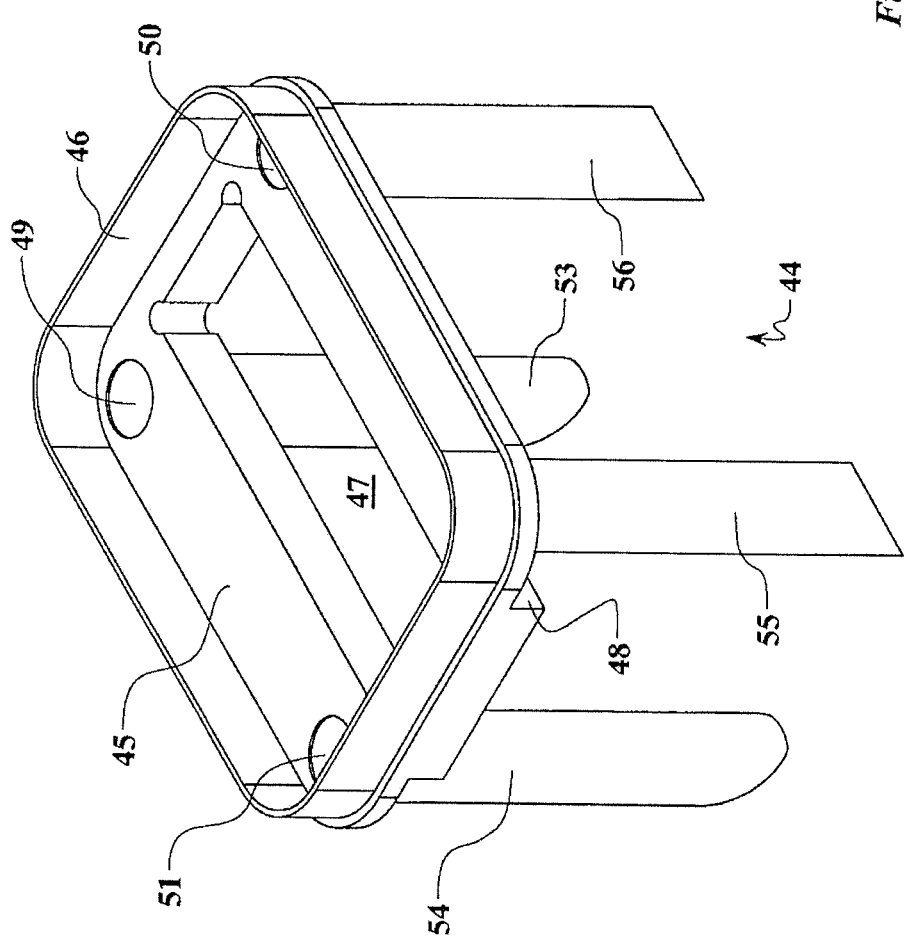
FIG. 8 shows the discharge unit of the exemplary embodiment according to FIG. 7 in an enlarged illustration.

A further exemplary embodiment is illustrated in FIGS. 7 and 8. The device being illustrated in FIG. 7 features a lid 36, which, with its edge 37, can be fitted on the collar of a solder crucible not being illustrated, sealing the same. In the lid 36, a soldering nozzle arrangement is arranged, which features a carrier 38 carrying a soldering nozzle 39. In this exemplary embodiment, the soldering nozzle is composed of a nozzle body 40, which features a plurality of nozzle openings 41 in the area of its upper end. At its lower end, the carrier 38 is connected to an ascension pipe 42, via which molten solder can be conveyed, using a conveyor unit, through a central recess 43 in the carrier 38 to the nozzle openings 41.

A discharge unit 44 such as can be seen in greater detail in FIG. 8 is arranged between the carrier 38 and the nozzle openings 41. The discharge unit 44, in a similar manner as the discharge units 09 and 19 having been described hereinbefore, features a baffle plate 45, which is limited by an edge 46 that surrounds it completely. The baffle plate 45 is furnished with a recess 47, which, with respect to its dimensions, substantially corresponds to the outer contour of the nozzle body 40, such that the discharge unit can be snapped on the nozzle body 40, reaching around the same in a substantially form-fitting fashion. In this respect, the discharge unit, with a flange-like edge 48 that reaches around the recess 47, comes to rest against a ledge 62 of the nozzle body 40, being supported by the same.

Moreover, the baffle plate, in this exemplary embodiment, features a multitude of full drain openings 49, 50, 51 and 52, through which any excess solder that flows off onto the baffle plate 45 can flow off back into the solder crucible. Below each drain opening 49, 50, 51 and 52, one downpipe 53, 54, 55 and 56 is in each instance arranged, which downpipe may extend up to a point below the solder level in the solder crucible or may also end slightly above the solder level.

As it can moreover be taken from FIG. 7, a roof-like gas injection cap 57 is provided, which is tapered in the direction of the nozzle openings, such that the free gap around the nozzle openings 41 can be kept as small as possible. Via a gas feeding unit, shielding gas, in particular nitrogen, can be fed into the space that is formed between the gas injection cap 57, the discharge unit 44 and the nozzle arrangement, in order to diminish, in particular, an undesired oxidation of the molten solder. In the present exemplary embodiment, the gas feeding unit features a hose 58 that is made from a porous glass fiber material and is arranged in a continuous annular gap 59 of the lid 36, said gap being open towards the space that is formed between the gas injection cap 57, the discharge unit 44 and the nozzle arrangement. If shielding gas, by way of an external shielding gas port 60, is now fed into the hose 58, said gas gets into the aforementioned space through the porous hose walls.

The invention claimed is:

1. A device for soldering electrical or electronic components on a printed circuit board, said device comprising:
   a solder crucible adapted to contain liquid solder, the liquid solder having a liquid solder surface level;
   at least one carrier including a carrier plate disposed above said solder crucible;
   a plurality of soldering nozzles extending upwardly from said carrier plate, wherein molten solder is conveyed out of the solder crucible and through a tip of each of the soldering nozzles to components to be soldered, said tips being at an upper end of said plurality of soldering nozzles; and
   a discharge unit for excess solder discharged by the plurality of soldering nozzles said discharge unit being arranged between said tips of said soldering nozzles and the carrier plate, wherein the discharge unit includes at least one substantially horizontal baffle plate surrounding the plurality of soldering nozzles, and the baffle plate includes a single drain opening for solder and a multitude of recesses through which the plurality of soldering nozzles extend, the entire baffle plate being spaced below said tips of said plurality of soldering nozzles and above said carrier plate, where the spacing distance of the baffle plate above the carrier plate or above the liquid solder surface level is selected to prevent spatter from being formed when the solder hits the carrier plate.

2. The device according to claim 1, in which the baffle plate surrounds the plurality of soldering nozzles in a substantially form-fitting fashion.

3. The device according to claim 1, in which the baffle plate is-one piece and includes at least one recess, into which the soldering nozzle extends.

4. The device according to claim 1, in which the baffle plate, at least in some areas, is limited by an edge projecting above a plane defined by the baffle plate in a direction of the soldering tip.

5. The device according to claim 1, including at least one downpipe for discharging the solder, said downpipe being arranged below the drain opening.

6. The device according to claim 1, in which an adjusting unit is provided, with which a distance between the baffle plate and the tip of the soldering nozzle can be set.

7. The device according to claim 6, in which the adjusting unit includes at least one adjusting screw extending through the baffle plate and engaging the carrier.

8. The device according to claim 1, including at least one gas injection cap introducing a shielding gas, said gas injection cap reaching around or over the discharge unit and the soldering nozzle.

9. The device according to claim 1, in which said carrier plate includes recesses through which excess solder flows back into said solder crucible.

10. The device according to claim 1, in which said plurality of soldering nozzles are arranged on said carrier plate.

11. The device according to claim 1, in which an upper edge of said carrier substantially surrounds and limits said carrier plate.

* * * * *